United States Patent
Sakai

(10) Patent No.: US 7,608,307 B2
(45) Date of Patent: Oct. 27, 2009

(54) METHOD OF FORMING FILM UPON A SUBSTRATE

(75) Inventor: Shigeki Sakai, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 704 days.

(21) Appl. No.: 10/533,810

(22) PCT Filed: Nov. 7, 2003

(86) PCT No.: PCT/JP03/14188

§ 371 (c)(1),
(2), (4) Date: Sep. 8, 2005

(87) PCT Pub. No.: WO2004/042110

PCT Pub. Date: May 21, 2004

(65) Prior Publication Data

US 2006/0246211 A1    Nov. 2, 2006

(30) Foreign Application Priority Data

Nov. 8, 2002   (JP)   .............................. 2002-325000

(51) Int. Cl.
  *C23C 8/00*   (2006.01)
  *C23C 16/00*   (2006.01)
(52) U.S. Cl. .................... 427/586; 427/585; 427/248.1; 427/255.5
(58) Field of Classification Search ........................ None
  See application file for complete search history.

(56) References Cited

U.S. PATENT DOCUMENTS 5,622,567 A * 4/1997 Kojima et al. ................ 118/726

FOREIGN PATENT DOCUMENTS

JP    60-162774     8/1985

(Continued)

OTHER PUBLICATIONS

Deppisch, G. "Schichtdickengleichmäßigkeit von aufgestäubten Schichten - Vergleich zwischen Berechnungen und praktischen Ergebnissen" [Layer Thickness Uniformity of Spray Coated Films - Comparison Between Calculations and Practical Results]. Vakuum-Technik, vol. 30, Issue 4, 1981. pp. 106- 114.

(Continued)

Primary Examiner—Timothy Meeks
Assistant Examiner—Kelly M Gambetta
(74) Attorney, Agent, or Firm—Oblon, Spivak, McClelland, Maier & Neustadt, L.L.P.

(57) ABSTRACT

A method of forming film on a substrate, in which in a preliminary step information on film thickness deposited on a test substrate prepared for use in collecting information over a fixed irradiation time is obtained in advance while shining a laser beam on a target, there being a fixed positional relationship between spatial positions of the test substrate and an incidence point of the laser beam on the target, or while shining the laser beam on the target while rotating the test substrate. In a main step, a deposition time at each relative positional relationship is adjusted based on film-thickness distribution information obtained in the preliminary step while spatially moving or rotating the substrate or substrate holder about a specific central axis of rotation relative to the incidence point of the laser beam to the target, or while performing both the relative rotation and relative movement.

18 Claims, 6 Drawing Sheets

FOREIGN PATENT DOCUMENTS

| | | |
|---|---|---|
| JP | 62-180063 | 8/1987 |
| JP | 02-163374 | 6/1990 |
| JP | 05-255842 | 10/1993 |
| JP | 6-220633 | 8/1994 |
| JP | 11-246965 | 9/1999 |
| JP | 2000-319096 | 11/2000 |
| JP | 2001-140059 | 5/2001 |
| JP | 2002-280306 | 9/2002 |

OTHER PUBLICATIONS

Greer, J.A. and Tabat, M.D. "Large-area pulsed laser deposition: Techniques and applications". Journal of Vacuum Sci. Technology, A 13(3), May/Jun. 1995. American Vacuum Society, 1995. pp. 1175-1181.

Dietsch, R., et al. "Large area PLD of nanometer-multilayers". Applied Surface Science, 197-198, 2002. pp. 169-174.

* cited by examiner

F I G. 3(A)
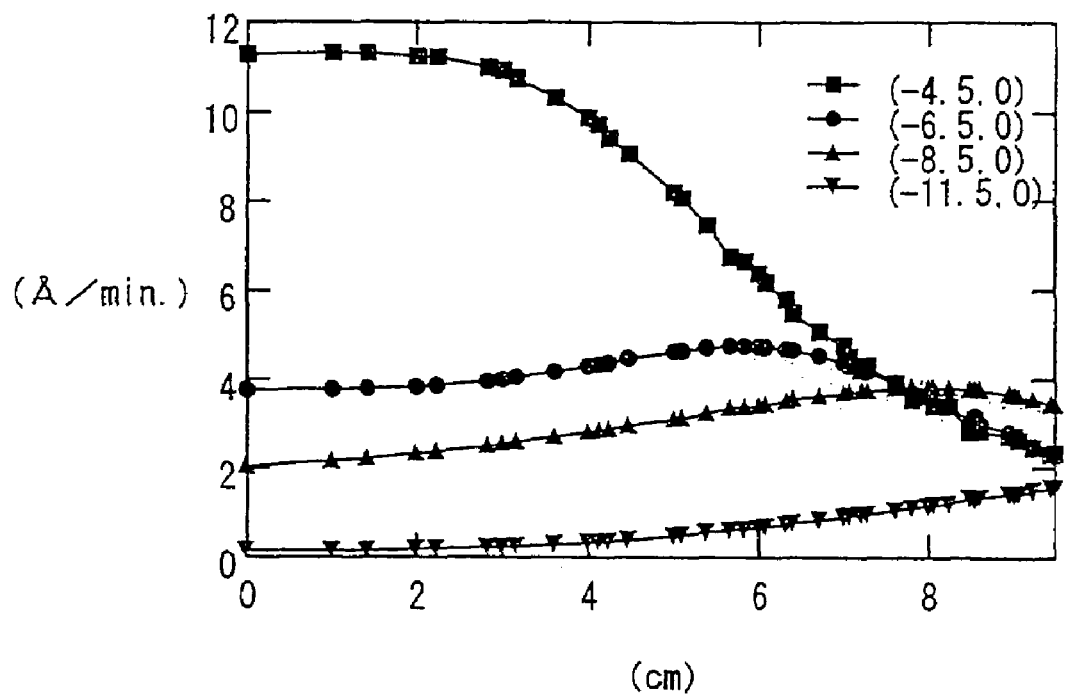
F I G. 3(B)
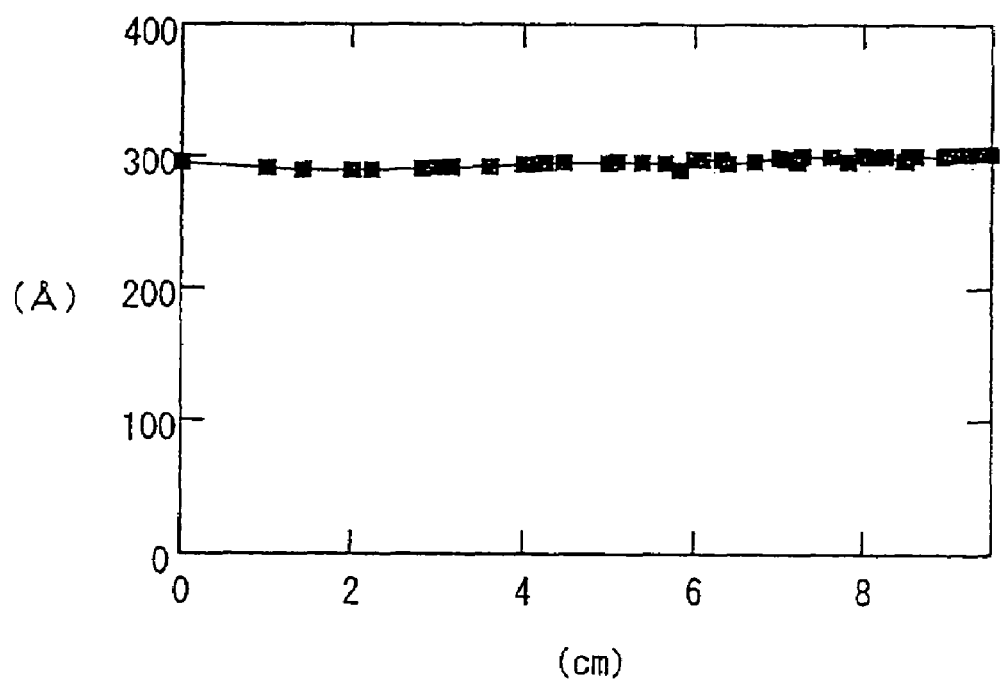

METHOD OF FORMING FILM UPON A SUBSTRATE

TECHNICAL FIELD

The present invention relates to an improvement in the formation of a film on a substrate using a film-forming method represented by a laser evaporation method that is called the laser ablation method or, in the case of the laser being a pulsed laser, the PLD (Pulsed Laser Deposition) method.

BACKGROUND ART

The laser evaporation method described above is used widely particularly on the research level in order to form thin films of many different materials including: oxide ferroelectric substances, insulators, conducting oxides, oxide superconductors, oxide magnetic materials, etc. This is because it has many advantages and is very promising.

FIG. 7 illustrates an example of the basic constitution of the apparatus used in this method, so to first explain the basic points thereof, a laser beam LB is shined from outside through a laser beam introduction window onto one or more targets 12 placed within a deposition chamber 13, the interior of which is evacuated to a stipulated degree of vacuum by means of a vacuum exhauster 14. Thereupon, the material making up the target in the vicinity of the surface of the target upon which the laser beam LB shines evaporates (ablates), and this target material is dispersed in the form of a type of mist-like mass called a plume 15 which is the light-excited state of the evaporated material that extends in a direction normal to the target and expands roughly symmetrically centered about this normal line, and this is deposited upon a substrate 11 supported by a substrate holder 21. A gas Gs may be introduced within the deposition chamber 13 if necessary; for example, oxygen is often introduced to form oxides, or nitrogen to form nitrides. In addition, the substrate 11 is typically heated by a heater 16 provided on the substrate holder 21, again if necessary.

With such a laser evaporation method, only those portions of the targets 12 upon which light is incident are locally ablated, so it is desirable that there is a tendency for the compound state of the target material be reflected straight into the state of the compound deposited upon the substrate. In addition, there is an advantage in that the optimal value for the pressure of oxygen or other gas introduced within the vessel can be very readily selected in a wide range from low vacuum to a high vacuum state. A film forming method that is often compared with this technique is the sputtering method, but this requires a discharge to be induced within the vessel and the main gas therein is argon. Accordingly, even if oxygen is introduced, the variable range of pressures is narrow, and if the object is to form an oxide film, the proper conditions often cannot be selected. In fact, an oxide superconductor, for example, produced by the laser evaporation method has a critical transition temperature $T_c$ equivalent to the bulk physical properties, and in the case of forming a thin film of a ferroelectric substance, its polarity value is large and it is structurally dense with a small leak current, so superior thin-film characteristics can often be obtained.

In this manner, the laser evaporation method has many superior advantages such as the superiority of the physical property control and characteristics of the formed thin film, the good versatility in that a considerable number of types of thin films can be produced, and the like, but there were still problems that remained to be solved. These were problems with the uniformity of thickness of the formed thin film, in that the distribution of thicknesses of thin films formed upon the substrate has up until now had a considerable range of variation. This was because, as described above, the plume 15 is formed from the spot where the laser shines onto the target (the target spot) in a direction nearly normal to the target, so the amount of deposition is greatest at the portion of the substrate corresponding to areas along the centerline of the plume 15, with deposition decreasing rapidly away from the centerline. This drawback naturally becomes more marked the greater the substrate surface area becomes, so the current situation is such that it is completely unsuited to film formation over large surface areas.

In fact, in order to solve this drawback, in the past, various improvements have been proposed such as moving or rotating the substrate, scanning the laser beam relative to the substrate and the like. However, as representative prior-art documents, even though Document 1: JP-Hei-5-255842A and Document 2: JP-Hei-11-246965A and others have demonstrated improvements, satisfactory results have still not been obtained, and although the range of fluctuation in the film thickness distribution was 10% or less in the former document, it has been difficult to reduce this to a range of 1-2%, and this was only roughly 6% even in the latter document, so a uniform film thickness has not been obtained.

Naturally, achieving a uniform film thickness distribution is a problem that is to be solved not only in the PLD method but also in the sputtering method described above and other film forming methods.

DISCLOSURE OF THE INVENTION

In order to achieve the aforementioned object, the present invention proposes, as a method of forming a film upon a substrate by means of the laser evaporation method wherein a laser beam is shined upon a target placed within an evacuated deposition chamber, so that target material in the portion of the target surface irradiated by the laser beam evaporates, and the evaporated target material is deposited upon the surface of a substrate supported by a substrate holder within the deposition chamber, prior to starting the main step of fabricating upon a substrate a thin film that can be provided for the ultimate use (the product thin film), in a preliminary step, obtaining in advance information on the thickness of film deposited upon a test substrate prepared for use in collecting information over a fixed irradiation time while shining the laser beam upon the target in the state in which there is a fixed positional relationship between the spatial positions of the test substrate and the point of incidence of the laser beam upon the target, or rather than that, while shining the laser beam upon the target while rotating the test substrate, and then; in the main step, adjusting the deposition time at each relative positional relationship based on the film-thickness distribution information obtained in advance in the preliminary step while spatially moving or rotating the substrate or substrate holder about a specific central axis of rotation relative to the point of incidence of the laser beam to the target, or while performing both relative rotation and relative movement. Note that in the preliminary step, if this film-thickness distribution information obtained in advance is collected a plurality of times with the fixed positional relationship itself varied between the test substrate and the point of incidence of the laser beam upon the target, then even more precise film-thickness control is possible in the main step.

Here, if the positional relationship (arrangement) is such that the centerline of the plume evaporating from the target does not intersect the substrate, this is often preferable in the application of the present invention.

In addition, the adjustment of the deposition time may be based on adjustment of the irradiation time of the laser beam, or it may be based on one or both of adjustment of the speed of revolution when continuously rotating the substrate, and adjustment of the movement speed when performing relative movement of the substrate.

Note that the aforementioned relative rotation is typically achieved by rotating the substrate or the substrate holder about its center, but it may also be achieved by moving the substrate or the substrate holder as a whole (or namely, rotating the laser beam incidence point spatially about a specific axis), although this will cause the apparatus configuration to become large in size. The relative movement can also be achieved by varying the light path of the laser beam and moving the spatial position of the point of incidence upon the target. In the latter case, when the range of movement is large, naturally the target itself must also be moved along with the variable light path of the laser beam. This is because it is meaningless if the laser beam does not constantly shine upon the target. Conversely, the target may remain fixed if the range of movement is small. The light path of the laser light is variable within the range in which the incidence to the target with its spatially fixed position is maintained.

Moreover, in order to prevent the so-called local "digging out" of the target, even in the case in which the spatial position of the point of incidence of the laser light is fixed, during the deposition, the target is moved within the plane containing the target.

A plurality of laser beams shining upon the target may be used, and there may also be a plurality of targets, where at least one or more laser beams shines upon each one of the plurality of targets, and also not one but a plurality of substrates may be supported by the substrate holder, and in each case the basic constitution of the film forming method of the present invention described above can be followed.

As a result of introducing the technique in the preliminary step as described above, it was found that the present invention is applicable also to other film evaporation techniques, namely resistance evaporation, electron beam evaporation, ion beam evaporation, sputter evaporation and the like. That is, generally speaking, in a method of forming a film upon a substrate wherein deposition is performed while a substrate or a substrate holder supporting this substrate within a deposition chamber is moved or rotated relative to the source of supply of deposition materials about a specific axis of rotation, or while performing both relative rotation and relative movement, with the present invention, in a preliminary step, information on the thickness of film deposited upon a test substrate prepared for use in collecting information over a fixed material supply time is obtained in advance while in the state in which there is a fixed positional relationship between the spatial positions of the test substrate and a reference point upon the deposition material supply source, or while rotating the test substrate, and then, in a main step, the material supply time is adjusted at each relative positional relationship based on the film-thickness distribution information obtained in advance in the preliminary step while spatially moving or rotating the substrate or substrate holder about a specific central axis of rotation relative to the deposition material supply source, or while performing both relative rotation and relative movement.

Here also, the film-thickness distribution information is preferably collected a plurality of times with the positional relationship itself varied between the test substrate and the deposition material supply source.

BRIEF DESCRIPTION OF THE DRAWINGS

FIG. 3(A) is a film thickness distribution plot illustrating a plurality of plots of the film thickness distribution information obtained in the preliminary step in another example of fabrication utilizing the present invention.

FIG. 3(B) is a film thickness distribution plot obtained by applying the present invention in this other Embodiment.

BEST MODE FOR CARRYING OUT THE INVENTION

Here follows a detailed description of the present invention made with reference to the appended drawings.

Figure 1A:
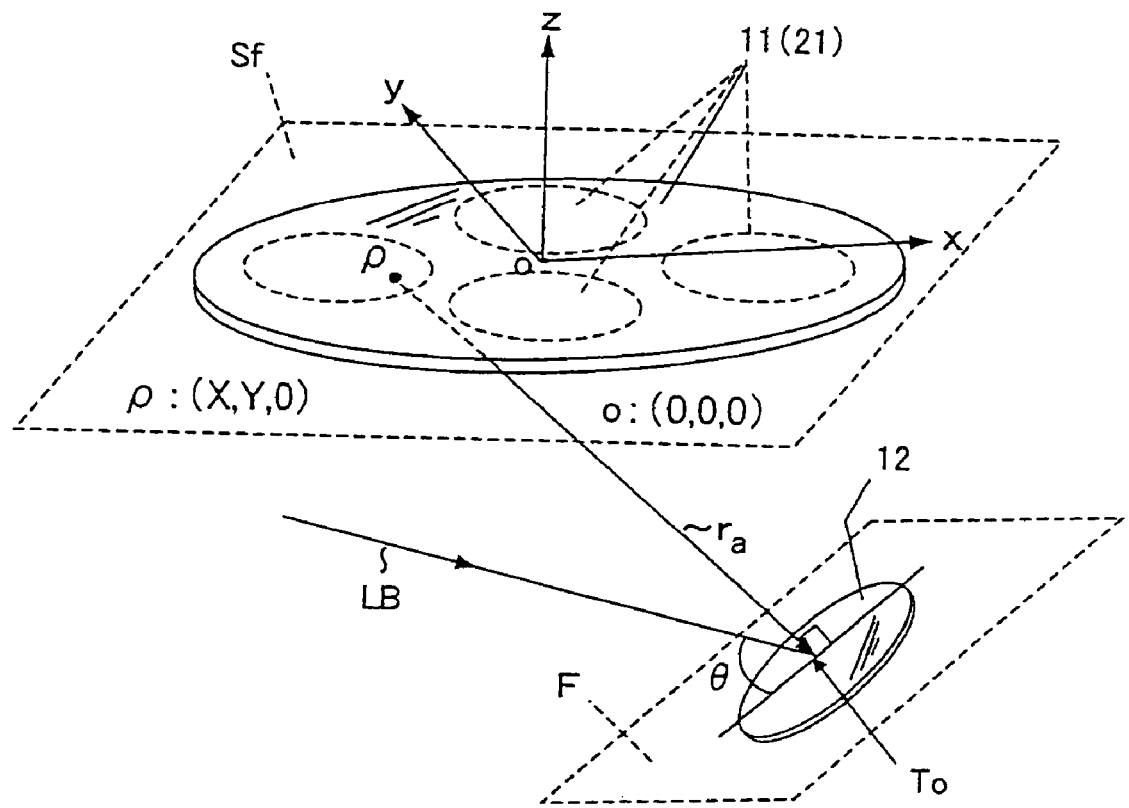
FIG. 1(A) is a schematic structural diagram of one embodiment of an apparatus that implements the method of the present invention.

FIG. 1(A) shows only the structure within an evacuated deposition chamber described previously but not shown in this diagram. In particular, it shows the substrate 11 and the substrate holder 21 which holds the substrate, along with a generalized example of the relative positional relationship among the laser beam LB and the targets 12 on which the laser beam LB shines.

In the illustrated case, the substrate 11 is assumed to have a typical circular wafer shape, but this is not necessarily so. In addition, the substrate holder 21 which holds the substrate 11 may have a constitution according to the prior art, and may take a form that holds one large substrate 11 or, as shown by the phantom lines in the diagram, may be one that holds a plurality of relatively small substrates 11 in a stipulated arrangement.

With the target 12 facing the substrates 11, there is no need for its surface (namely, the plane F containing this target 12) to be parallel to the plane $S_f$ containing the substrates, but rather, in the case in which laser evaporation is applicable to a large-diameter substrate 11 (even in the case of a plurality of substrates, the total surface area becomes large as a result of making the number of substrates large) by means of the present invention, the arrangement at an inclination as shown in the figure is typical so that the light path of the laser beam LB is not impeded by this substrate 11.

Figure 7:
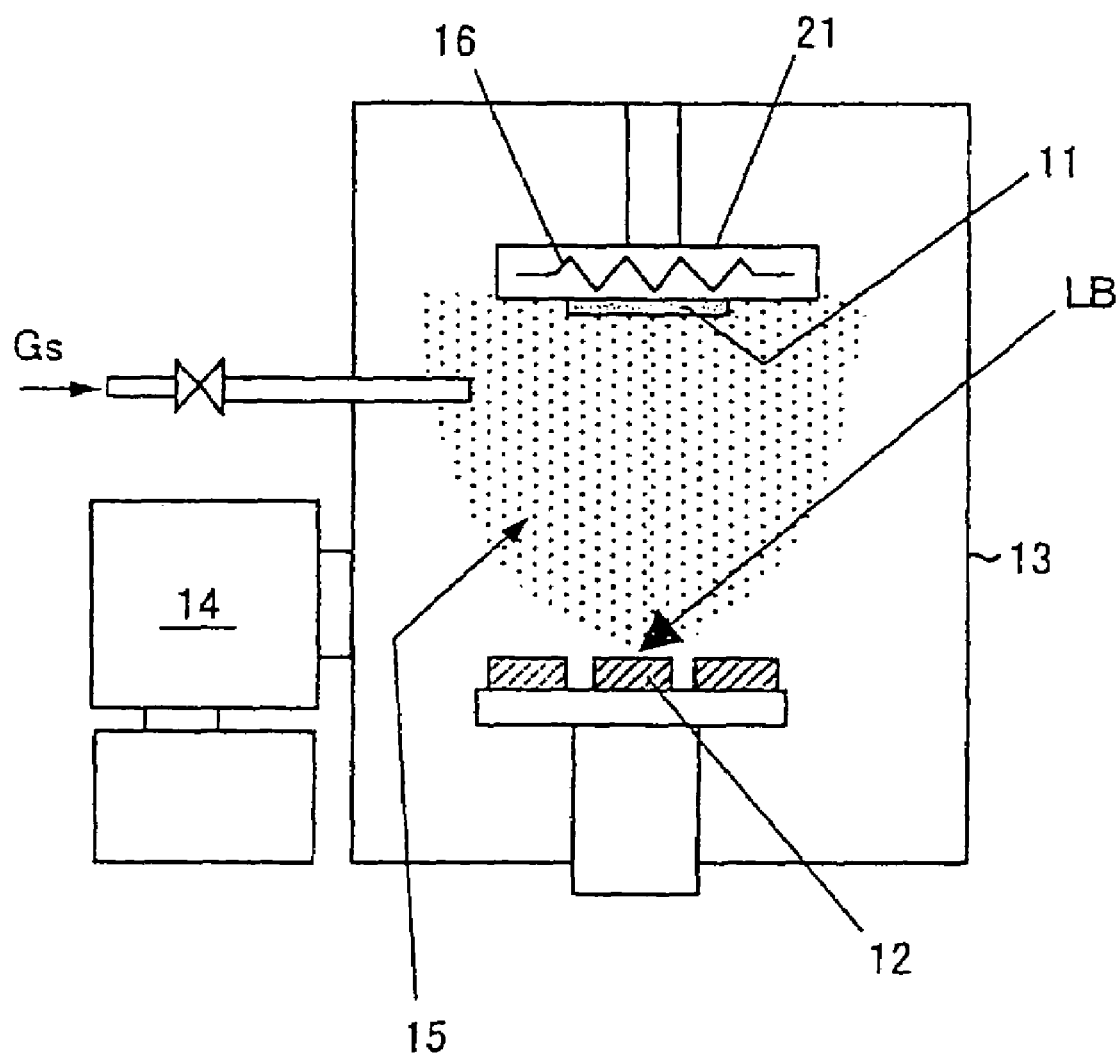
FIG. 7 is a schematic structural diagram illustrating a known basic example of the constitution of an apparatus that applies a typical laser evaporation method to form a thin film upon a substrate.

For simplicity in the following, the laser beam LB is assumed to be a typical pulsed laser, and accordingly we shall continue the description here assuming that the laser evaporation method is the aforementioned PLD method in particular, but if the positional relationship is described in advance, the laser beam LB is incident to the target 12 at an arbitrary angle. However, the aforementioned plume 15 (FIG. 7) formed by the evaporation of target material is assumed to extend roughly in the direction normal to the target at the laser beam incidence point $T_o$. In other words, regardless of the angle of incidence of the laser beam LB, the centerline of the plume 15 is typically normal or nearly normal to the target surface.

As shown in the figure, let θ be the angle between the laser beam LB and the target surface at this target incidence point $T_o$ (called the angle of incidence), and let ρ be the point at which the line normal to the target 12 from the laser beam incidence point $T_o$ (spatially occupying a specific position) intersects the plane $S_f$ containing this substrate 11. Thus, one can consider the vector $r_a$ extending from this point ρ toward the laser beam incidence point $T_o$ of the target 12. In this document, the symbol "$r_a$" is represented with simply lower-case letters, and while this differs from vector notation in ordinary mathematical notation, it is merely for convenience in notation.

The substrate 11 is round in this case, so upon placing the x-axis and y-axis in the two-dimensional directions within the plane, and the z-axis in the direction perpendicular thereto, the center of this circular substrate 11 is assumed to be the origin o (0,0,0) and accordingly the aforementioned point ρ is at the coordinates (X,Y,0). In the illustrated case, this point ρ intersects the surface of the substrate 11, but in fact, as long as it lies upon the plane $S_f$ containing the substrate 11, it may also be at a position outside of the substrate 11 that does not intersect the substrate 11. Simply put, the relative positional relationship may be such that the normal line at the target incidence point $T_o$ that the laser beam LB shines on need not intersect the substrate 11, but rather it intersects the plane $S_f$ containing the substrate 11 but outside of it. In fact, such an arrangement often gives better results.

Figure 1B:
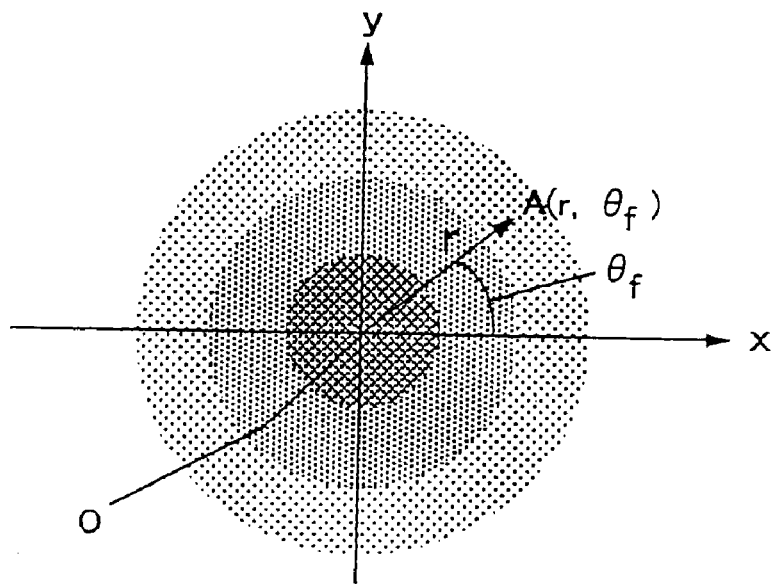
FIG. 1(B) is an explanatory diagram used to illustrate the in-plane distribution of film thicknesses within a thin film formed upon a substrate.

Now, assuming that an arbitrary single arrangement represented by a set of the coordinates (X,Y), the vector $r_a$ and the angle θ is selected, we will first continue the description under the condition that the substrate 11 does not rotate, while considering the planar schematic diagram shown in FIG. 1(B). When the PLD method is applied assuming only the techniques used so far, under the respective specified temperature conditions, laser energy, exposure time, vacuum atmosphere and atmospheric gas atmosphere, the in-plane distribution of the thickness of the deposit (thin film) produced upon the substrate 11 within a unit time is a function of the position within this plane. Taking this function to be A, as shown in FIG. 1(B), the position of an arbitrary point can be represented in polar coordinates as r, $θ_f$ from the center of rotation of the substrate holder or substrate, and this function A can be represented by the formula:

$$A(r, θ_f) \quad (1)$$

Figure 2A:
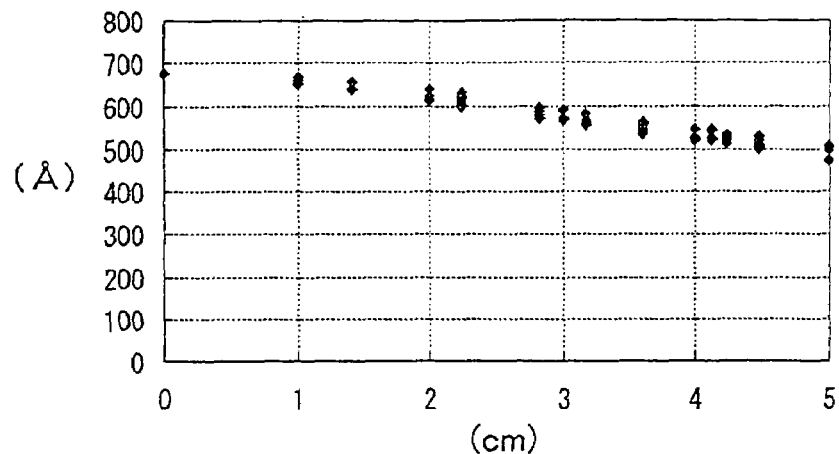
FIG. 2(A) is a plot of the film thickness distribution obtained in the preliminary step in Embodiment 1 that applies the present invention.

As is, the dispersion in film thickness becomes considerably large as shown in FIG. 2(A), for example, to be described later again. In FIG. 1(B), the plume concentration typically becomes greater near the center, so the in-plane distribution of the film thickness actually varies continuously accordingly, but for convenience in representation, this change in in-plane distribution is represented by the dot density or darkness in stages. Naturally, again for simplicity, the distribution is shown in the figure with circular symmetry, but in fact this is not commonly so.

Thus, in the present invention, we shall first consider performing film formation while rotating the substrate 11 (simply at a uniform speed of revolution). As described later, this rotation may be rotation relative to the target 12, but typically the substrate 11 or substrate holder 21 is rotated about its central axis. In this case, the film-thickness distribution B within a unit time can be represented by Equation (2) below as a function of the radius vector r.

$$B(r) = (1/2π) \int_0^{2π} A(r, θ_f) dθ_f \quad (2)$$

Note that the positions of the subscripts indicating the range of integration in the above are slightly off because of the printed representation using a word processor, but to be clear, the range of integration is from 0 to 2π.

From the equation above, at each of an appropriate number of positions N represented by the coordinates X,Y, the vector $r_a$ and θ (called arrangement 1, arrangement i, ... arrangement N, respectively), if the film thickness distribution per unit time without rotating the substrate is found at least once at each of these respective arrangements in a test substrate prepared as a preliminary step, then in this step, it is possible to form a thin film with a considerably uniform thickness distribution by adjusting the length of a parameter, e.g. the deposition time, at each position while rotating at a uniform speed of revolution. If the functions A and B of Equations (1) and (2) above for each arrangement i are represented with subscripts as $A_i$ and $B_i$ for the subscript i, and the deposition time at arrangement i is represented as $t_i$ the film thickness distribution C at this time is again a function of the radius vector r as shown in Equation (3) below.

$$C(r) = \sum_{i=1}^{N} B_i(r) t_i \quad (3)$$

Here also the positions of the subscript i=1 below the Σ symbol and the superscript N above are slightly off because of the printed representation.

Naturally, adjusting the deposition time (plume exposure time) as the adjusted parameter is the simplest and most workable, but it is also possible to adjust other film formation parameters related to film thickness, e.g. the shined laser energy or the like, or both of these can be adjusted together. From the present inventors' experiments, it was found that, depending on the case, the film thickness distribution will change even by varying the angle of incidence θ of the laser beam LB to the targets 12, so by obtaining film thickness distribution information with respect to the change in θ in preliminary steps in advance, the variation and adjustment of this θ can also be used to adjust the film thickness distribution. Moreover, even when not at a uniform speed of revolution the process of making the film thickness uniform is theoretically possible, although the calculations become complex. The fact that the film thickness can be made uniform by means of the present invention, or namely that the film thickness can be adjusted, means that conversely obtaining a desired film thickness distribution that is not a uniform film thickness distribution is also naturally possible. Specifically, with the present invention, being able to obtain the intended film thickness distribution is possible at once.

Nevertheless, if $r_a$ and $\theta$ are made fixed and X,Y only are varied, there are cases in which this is advantageous such as by simplifying the mechanism of movement. For an arrangement in which $X=X$ and $Y=Y_0$, the film thickness distribution per unit time $A(r,\theta_f)$ is found once in a preliminary step in the state with the substrate holder 21 halted. Here, as is understandable upon imagining the place above, considering that this substrate 11 is rotated relative to the target while the arrangement is changed from $X=X_0$, $Y=Y_0$ to $X=X_j$, $Y=Y_j$, the film-thickness distribution $B_j$ per a unit time can be represented by Equation (4) below $$B_j(r) = (1/2\pi)\int_0^{2\pi} A_0(r', \theta'_f)d\theta_f \quad (4)$$

where, $r'=\{(r\cos\theta_f-x_s)^2+(r\sin\theta_f-y_s)^2\}^{1/2}$ $\tan\theta'_f=(r\sin\theta_f-y_s)/(r\cos\theta_f-x_s)$ and $x_s$, $y_s$ represents the amount of movement. Namely, $x_s=X_j-X_0$ $y_s=Y_j-Y_0$.

Because of this, in the present invention, by varying only X,Y and finding the film-thickness distribution generated at a stipulated time or within a unit time when rotation is halted at the arrangement $X_0,Y_0$ once on a test substrate, by adjusting the deposition time $t_j$ at the arrangement j while rotating in compensation therefore, in this step it is possible to obtain a uniform or desired film-thickness distribution upon the substrate. The film-thickness distribution at this time can be represented by Equation (5) below.

$C(r)=\Sigma_j B_j(r)t_j \quad (5)$

Note that in the above, the substrate 11 is rotated or translated, but this may naturally be movement relative to the target 12 or the laser beam LB incidence point $T_o$. Specifically, one can see that the substrate 11 may be fixed and the illuminated point $T_o$ may be rotated or moved. Furthermore, the adjustment of the deposition time $t_j$ may be essentially accomplished by adjusting the illumination time of the laser beam LB, or otherwise by adjusting the speed of revolution during relative rotation, or by adjusting the movement speed during relative movement.

Even in the preliminary step, it is also valid to obtain the film-thickness distribution information in advance by rotating the substrate holder 21 at a uniform speed of revolution rather than while halted. The film-thickness distribution of the product per unit time is found at a certain arrangement represented by the set of coordinates (X,Y), the vector $r_a$ and the angle $\theta$. Thus, B in Equation (2) is found directly in the preliminary step. By finding the film-thickness distribution at several required arrangements while rotating the substrate 11 at a uniform speed, it is possible to adjust the deposition times at each respective arrangement, and thus obtain the uniform and desired film-thickness distribution.

By selecting an appropriate number of arrangements j and for each of these arrangements j, using the distribution $B_j(r)$ at the time that the substrate holder 21 is rotated and the adjusted deposition time $t_j$, the uniform and desired film-thickness distribution is obtained as expressed previously in Equation (5). Accordingly, as an example of another technique, assuming that $B_j(r)$ and $C(r)$ in Equation (5) are known, the deposition time $t_j$ at each of the arrangements j can be determined in the manner of solving an inverse problem. Although this is not a limitation to this solution, using the following technique for example is convenient.

Let M be the number of arrangements selected. The index j representing the various arrangements takes values from j=1 to j=M. The range of radii upon the substrate holder over which this desired film-thickness distribution is to be obtained may be the entire surface, but rather, in consideration of the case in which an annular surface-area range is desired, let it be $0 \leq r_u \leq r \leq r_v$. Here, select a suitable radius $r_s$ within the range $r_u \leq r \leq r_v$, and let the desired film thickness there be $C(r_s)$. This $C(r_s)$ is the sum of the amount deposited at each of M arrangements, giving rise to Equation (6) below.

$$C(r_s) = \sum_{j=1}^{M} C'_j(r_s) \quad (6)$$

Here, $C'_j(r_s)$ is the amount deposited in each arrangement j, and this value can be found in advance by trial. Moreover, the deposition time $t'_j$ at this time is found by Equation (7) below using the film-thickness distribution per unit time $B_j(r)$ according to Equation (4) above.

$t'_j=C'_j(r_s)/B_j(r_s) \quad (7)$

Then, this $t'_j$ (j=1, 2 . . . , M) is used to calculate the film thickness $C'_j(r)$ with respect to r in the range $r_u \leq r \leq r_v$ where not $r=r_s$. Next, other combinations of $C'_j(r_s)$ are selected so as to satisfy Equation (6) above, and a similar calculation is done to find $C'_j(r)$.

Repeat this procedure and make appropriate judgments from the information thus obtained to select the deposition time $t'_j$ with respect to the combination of $C'_j(r_s)$, or namely the arrangement j that is closest to the desired film-thickness distribution. Upon following this procedure, this $t'_j$ will become none other than the $t_j$ of Equation (5).

Note that as the number of arrangements M in the above preliminary step for obtaining a uniform or desired film-thickness distribution C(r), the greater the number is better, but according to the experiments of the present inventors, roughly 2-5 is realistically sufficient.

In addition, even if the spatial position of the incidence point $T_o$ is fixed, rotating or translating the target 12 within the plane F that contains this target 12 so that the laser beam LB scans relatively across the surface of the target 12 is also a very effective consideration in practical use. This is because it is possible to prevent the "digging out" of only one portion of the target 12. Specifically, when the laser beam LB is shined along a fixed light path, even if the spatial position of the incidence point $T_o$ is fixed, it is effective for the ablating point itself on the target surface to be changed constantly. The number of laser beams is also not limited to one. More than one beam may be used at once, and in this case also, by means of the previous technique, by adjusting the deposition parameters, mainly the laser beam irradiation time $t_i$ at various locations and various positions of angular rotation based on product distribution (film-thickness distribution) information in preliminary steps obtained within unit times in the state of no relative rotation or movement between the substrate 11 and the target irradiation point (origin of generation of the plume) $T_o$ and film-thickness distribution information obtained a plurality of times by varying the positional relationships, a thin film can be produced with a uniform or the desired film-thickness distribution.

Here follows examples of actual fabrication performed in accordance with the present invention. As the substrate 11, a 10-cm diameter silicon substrate was selected and this was supported upon a substrate holder of roughly the same diameter. The target 12 material is $HfO_2$. The atmospheric gas is a gas mixture of oxygen and nitrogen, and the interior of the deposition chamber is evacuated to a vacuum of 0.1 Torr. The laser beam LB used is a KrF excimer laser pulse with a wavelength of 248 nm.

First, as a comparative example of the prior-art method, the parameters for the relative positional relationships are set to: the target 12 inclination θ is 30°, the length of vector r is 5 cm, the coordinates (X,Y) of the point A where the target normal line intersects the plane $S_f$ containing the substrate are (−5,0) in cm units, or namely in vector representation, vector r is (5 cos 60°, 0, −5 sin 60°), and deposition was performed for 86 minutes while rotating the substrate 11.

Thereafter, when the film thickness was measured by means of spectroscopic ellipsometry, the results are as shown in FIG. 2(A), where the film thickness fluctuated by as much as roughly 200 Å(angstroms) between the center point and the outermost periphery, thus exhibiting extremely large non-uniformity. Note that this operation is equivalent to obtaining film-thickness distribution information in the preliminary step when the present invention is to be applied to improve this situation.

Figure 2B:
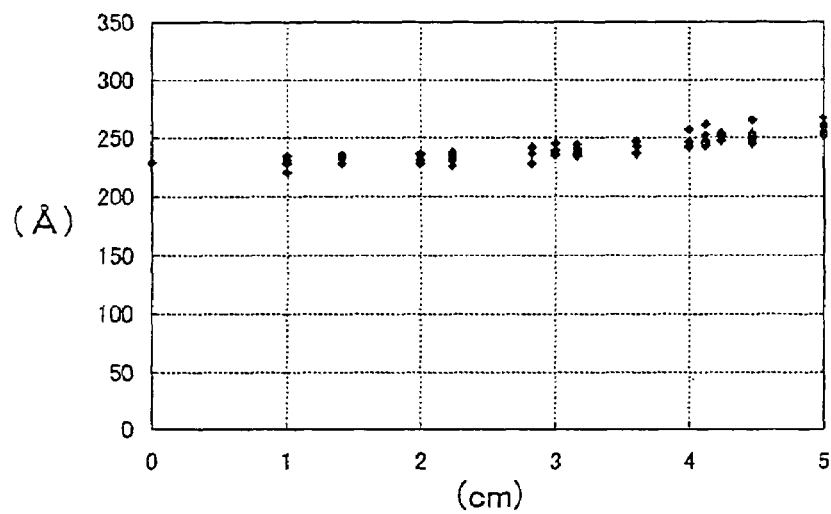
FIG. 2(B) is similarly a film thickness distribution plot illustrating another film thickness distribution obtained by varying the conditions in the preliminary step.

Next, as a result of trying deposition under the same conditions as above but with the point at which the target normal intercepts the plane $S_f$ containing the substrate removed from the substrate 11 and put at (X,Y)=(−7,0) (units are similarly cm) on the outside of the substrate, one can say that there was some improvement as shown in FIG. 2(B), but there was still roughly 30 nm of dispersion in the film thickness, and this would have been an intolerable state if the substrate was of any larger radius. This characteristic can also become separate film-thickness distribution information obtained upon a separate test substrate in the preliminary step.

Figure 2C:
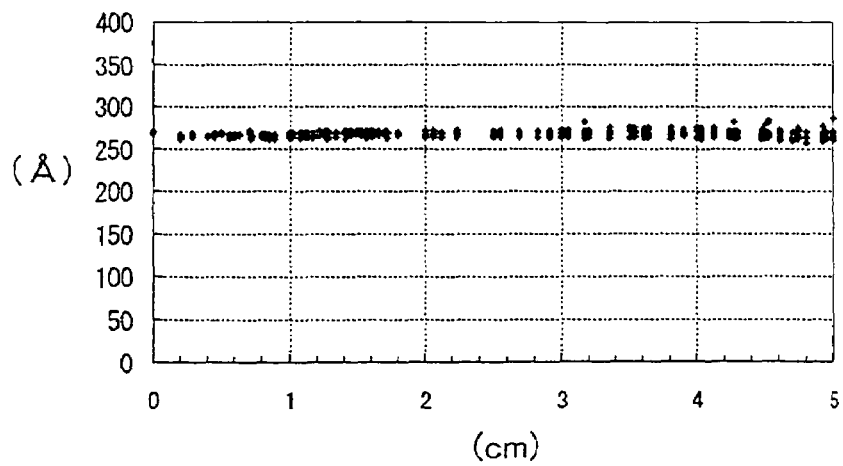
FIG. 2(C) is a film thickness distribution plot obtained as a result of applying the present invention based on the film thickness distribution information obtained in the preliminary step.

Thus, in accordance with the method of the present invention described so far, when compensation was performed by a step equivalent to the main step based on film-thickness distribution information obtained from FIGS. 2(A) and (B) above, and adjustment of the deposition times at various positions was performed while rotating the substrate 11, as shown in FIG. 2(C), extremely good results were obtained with regard to the film-thickness uniformity wherein the range of film-thickness fluctuation was kept within only ±1%. Note that in the figures, the positional measurement results having a range extending up and down from the same center position is dispersion caused by measurement with the spectroscopic ellipsometry method.

To present still another embodiment of the present invention, as the substrate 11, an even larger 20-cm diameter silicon substrate was selected and this was again supported upon a substrate holder of roughly the same diameter. In the same manner as the example of fabrication above, the target 12 material is $HfO_2$, the atmospheric gas is a gas mixture of oxygen and nitrogen, and the interior of the deposition chamber is evacuated to a vacuum of 0.1 Torr. The laser beam LB used is again a KrF excimer laser pulse with a wavelength of 248 nm.

The parameters for the relative positional relationships are set to: the target 12 inclination θ is 30°, the length of vector r is 5 cm, the coordinates (X,Y) of the point A where the target normal line intersects the plane $S_f$ containing the substrate are (−4,5,0) in cm units, and deposition was performed while rotating the substrate 11. Thereafter, when the film thickness was measured by means of spectroscopic ellipsometry, the results are as shown as the solid squares in FIG. 3(A). Here, the deposited film thickness is divided by the deposition time to give the deposited film thickness per minute. When the same thing was performed at the arrangements of (X,Y)=(−6,5,0), (X,Y)=(−8,5,0) and (X,Y)=(−11,5,0), respectively, the results shown in FIG. 3 were again obtained.

Ultimately, by collecting film-thickness distribution information a plurality of times by varying the arrangement in the preliminary step, adjustment of the deposition times at various positions was performed while rotating the substrate 11 according to this information and the aforementioned method of the present invention.

Specifically speaking, when the desired film thickness to be obtained was set to 300 angstroms, by setting the deposition times at each of the arrangements of (X,Y)=(−4,5,0), (X,Y)=(−6,5,0), (X,Y)=(−8,5,0) and (X,Y)=(−11,5,0) to 17 minutes 37 seconds, 17 minutes 37 seconds, 10 minutes 42 seconds and 123 minutes 45 seconds, respectively, as shown in FIG. 3(B), extremely good results were obtained. Even though this was a large-diameter 20 cm wafer, the average value of the in-plane film-thickness was 296.3 angstroms, and the range of fluctuation within the surface was only ±2.4%. Even when expressed as a coefficient of fluctuation with respect to the desired film thickness of 300 angstroms, this was no more than a little at less than 1.2%. Note that as described previously, the arrangement of (X,Y)=(−11,5,0) is an arrangement wherein the centerline of the plume evaporated from the target does not intersect the 10-cm radius substrate.

In the above, the adjustment of the deposition time at each position of angular rotation was performed by literally adjusting the laser irradiation time at each position, but as touched upon previously, even adjustment of the speed of revolution in the continuously rotating state will also equivalently adjust the deposition time at each location. Naturally, both the laser irradiation time and the speed of revolution can be adjusted together and moreover, lateral translation of the substrate 11 may also be applied (but actually, this will be movement of the substrate holder 21 or relative movement of the targets 12), and the movement speed at this time can also be made a parameter for adjusting the deposition time. In addition, it is readily understandable that the present invention may be applied to obtain not only a uniform but any desired film-thickness distribution.

Nevertheless, as described above, as a result of considering the laser evaporation method, it was found that the method of the present invention is conversely applicable also to other film forming techniques. That is, it is equally applicable as long as it is a film forming method wherein deposition is performed while the substrate or substrate holder is moved or rotated relative to the source of evaporation of deposition materials (supply source) about a specific axis of rotation, or while performing both relative rotation and relative movement. It is thus applicable to resistance evaporation, electron beam evaporation, ion beam evaporation, sputter evaporation and the like.

In order to form a thin film uniformly across a large surface area, it was conventionally thought to be necessary to maintain an adequate separation in distance between the material supply source and the substrate upon which the thin film is to be deposited. But if so, as the substrate becomes larger, naturally the apparatus (deposition chamber) must also continually become larger. However, if the concept of the present invention is applied here, the apparatus need not become so large.

Figure 4:
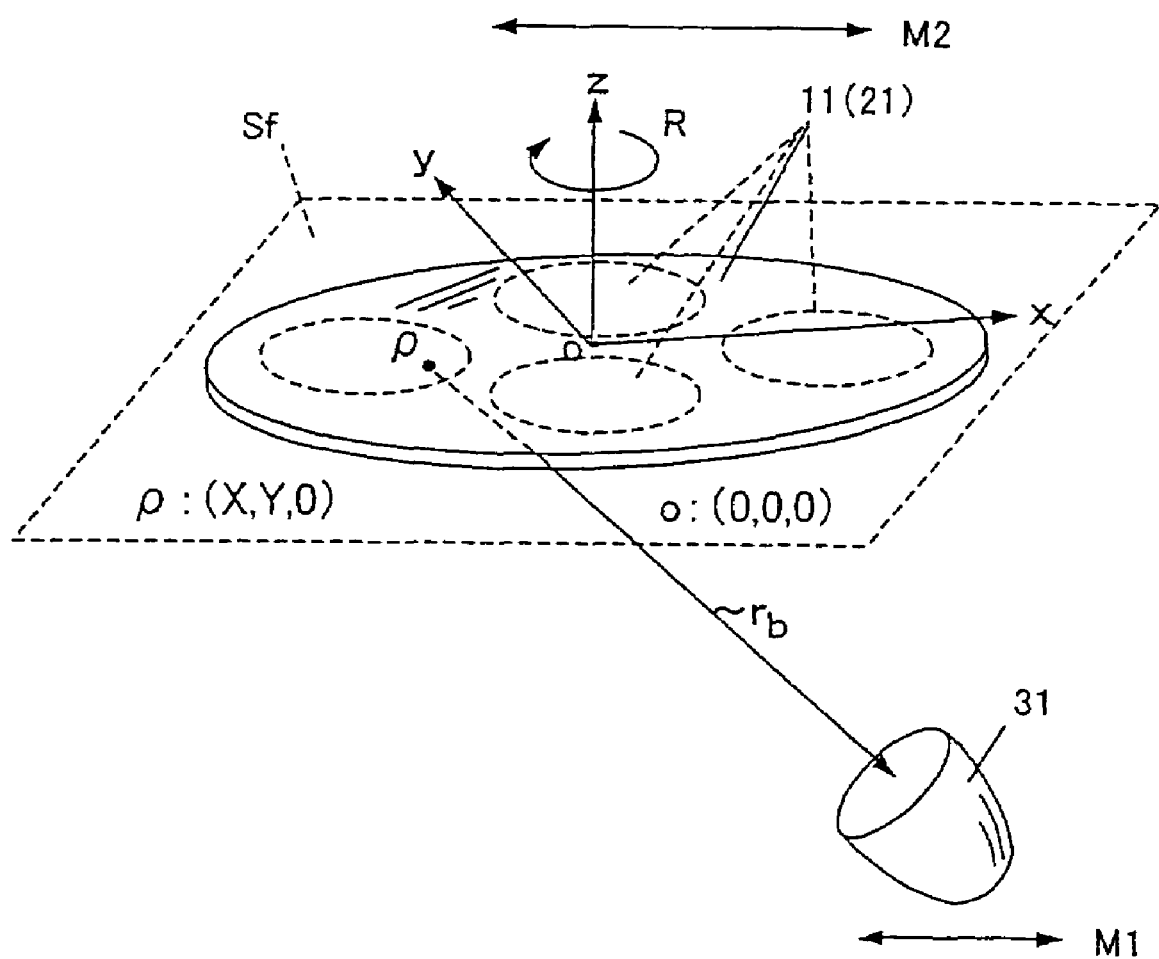
FIG. 4 is a schematic structural diagram of an embodiment wherein the method of the present invention is applied to a evaporation method other than the laser evaporation method.

For example, as shown in FIG. 4, even though the distance between the material supply source 31 and the substrate 11 or substrate holder 21 is short, according to the technique of the present invention in the same manner as described above in regard to the laser evaporation method, after performing film formation upon a test substrate in a preliminary step and obtaining film-thickness distribution information, in the main step, it is sufficient to adjust the deposition time (material supply time) at each relative positional relationship based on the film-thickness distribution information (preferably a plurality of times thereof) obtained in advance in the preliminary step while spatially moving (M2 and/or M1) or rotating (R) the substrate 11 or substrate holder 21 about a specific central axis of rotation z relative to the material release (spray) reference point that is set in advance on the material supply source 31, or while performing both such relative rotation R and relative movement (M2 and/or M1). The various considerations described above regarding the collection of information can be also similarly adopted here. Naturally, during the translation of the substrate 11 or substrate holder 21 relative to the material supply source 31 along the arrows M2 and/or M1 also, the vector $r_b$ that indicates the positional relationship between the material supply source 31 and the plane $S_f$ containing the substrate 11 or substrate holder 21 is fixed while the point of intersection p between this vector $r_b$ and the plane $S_f$ is made to move upon the plane $S_f$. Regarding considerations at the time of fabrication, it is possible to follow the explanation presented previously with respect to FIGS. 2 and 3.

With such a constitution, even if the substrate 11 or substrate holder 21 becomes large in diameter, the apparatus dimensions in the direction perpendicular to the plane $S_f$ containing the substrate 11 can be made markedly smaller than in the conventional constitution, and the entire apparatus can be kept compact. Taking the ratio of the substrate (substrate holder) diameter to the distance from the substrate (substrate holder) to the material supply source 31 to be:

substrate (substrate holder) diameter: distance from substrate (substrate holder) to material supply source 31=1:d where d=2 to 10 in a conventional resistance-heated apparatus or electron beam evaporation apparatus, d<1 is possible with the present invention. Naturally, if the direction of translation is a single direction, then the apparatus configuration is markedly simplified, but in accordance with the method of the present invention, even with this configuration, a thin film with a uniform or desired film-thickness distribution can be formed. Note that in the case of sputtering, essentially a pair of electrodes face each other, so the substrate is positioned on the side of one electrode, but the geometric reference point where the vector $r_b$ intersects from the side of the other electrode can also be determined on the material supply source, so it is possible to adopt the technique of the present invention in the same manner as described above. This is also naturally exactly the same for the electron beam evaporation method and ion beam evaporation method, so the geometric reference point can be set on the surface of the crucible containing molten material.

Figure 5:
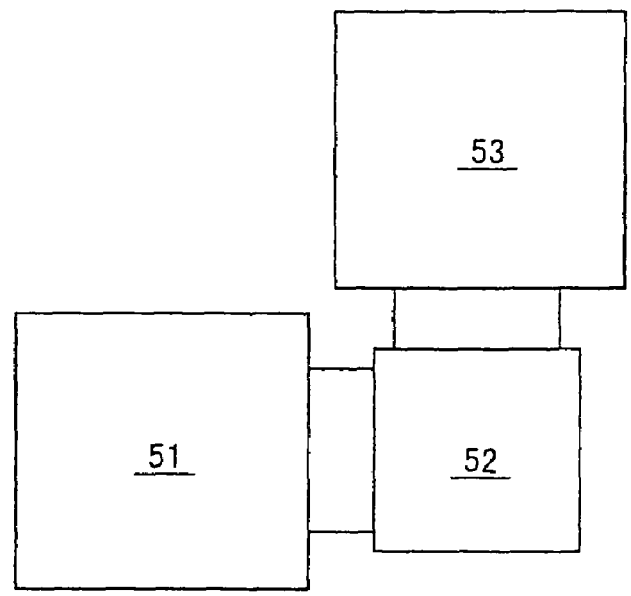
FIG. 5 is an example of the structure of an apparatus system suited to the implementation of the method of the present invention.

When putting together an apparatus to implement the method of the present invention, it is convenient if the work in various steps in the vacuum environment and the non-vacuum environment can be performed continuously. Thus, a system such as that shown in FIG. 5 is conceivable. It comprises a deposition chamber 51 typically placed in a vacuum environment where evaporation is actually performed by means of an evaporation method selected from among laser evaporation, resistance heating evaporation, electron beam evaporation, ion beam evaporation, sputtering evaporation or the like, a storage chamber 53 that stores a plurality of substrates or substrate holders loaded with substrates before or after film formation, and if necessary, a loading/unloading chamber 52 between these two chambers constituted so as to load and unload the substrates or substrate holders without breaking the vacuum on the vacuum environment side, joined in series.

Figure 6:
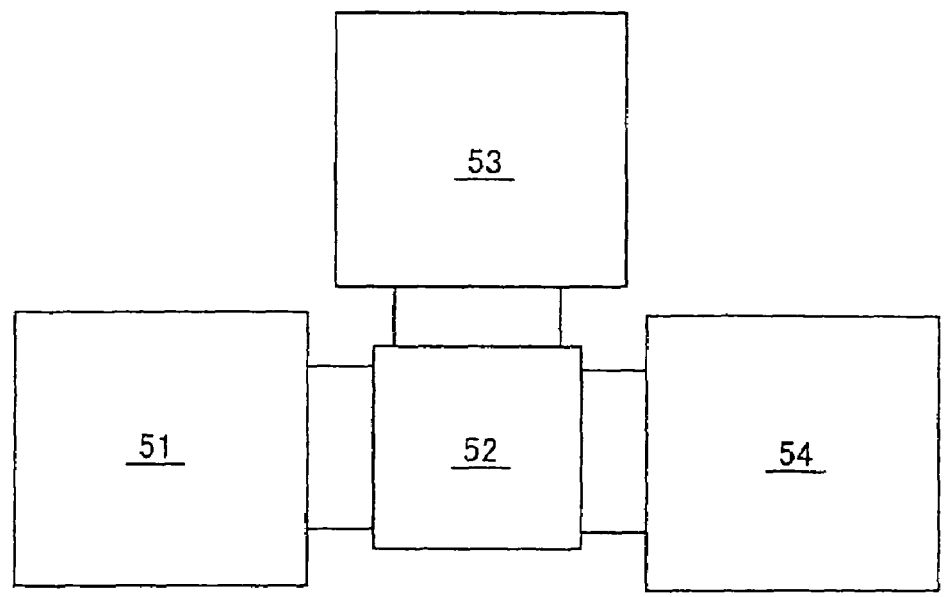
FIG. 6 is another example of the structure of an apparatus system suited to the implementation of the method of the present invention.

For even more convenience, as shown in FIG. 6, in addition to the deposition chamber 51, storage chamber 53 and loading/unloading chamber 52 described above, an evaluation chamber 54 used to determine the film-thickness distribution in the preliminary step and also evaluate the film-thickness distribution in this preliminary step in order to determine the deposition times and the like may also be joined to the loading/unloading chamber 52.

As the method of evaluating the film-thickness distribution, it is convenient to use the aforementioned technique that utilizes an ellipsometer, but this is not a limitation. As the carrier for a substrate or substrate holder that does not break the vacuum, a mechanism utilizing a known robot arm or carrier rod can be adopted.

INDUSTRIAL APPLICABILITY

As described above, with the present invention, the uncontrollability of the film-thickness distribution of film formed upon a substrate can be greatly improved, and an extremely uniform film-thickness distribution can be obtained and also the desired film-thickness distribution can be obtained. With regard to applications in which a uniform film-thickness distribution is to be obtained, in other words, it is possible to use substrates of a larger diameter than in the past. The contributions of the present invention to various required film forming applications are extremely large.

The invention claimed is:

1. A method of forming a film upon a substrate by means of a laser evaporation method wherein a laser beam is shined upon a target placed within an evacuated deposition chamber, so that target material in a portion of the target surface irradiated by said laser beam evaporates, and said evaporated target material is deposited upon a surface of the substrate supported by a substrate holder within said deposition chamber, said method of forming the film upon the substrate comprising:

in a preliminary step, obtaining in advance information on a distribution of a thickness of a film deposited upon a test substrate prepared for use in collecting information over a fixed irradiation time while shining said laser beam upon said target in the state in which there is a fixed positional relationship between the spatial positions of said test substrate and a point of incidence of said laser beam upon said target, or while shining said laser beam upon said target while rotating said test substrate, and then;

in a main step, adjusting a deposition time at each relative positional relationship based on the film-thickness distribution information obtained in advance in the preliminary step while spatially moving or rotating the substrate or substrate holder about a specific central axis of rotation relative to the point of incidence of said laser beam to said target, or while performing both said relative rotation and said relative movement, and solving an inverse problem using a uniform or a desired film-thickness distribution and the film-thickness distribution information obtained in advance at each relative position, to thereby determine the deposition time at each relative position.

2. A method of forming a film upon a substrate according to claim 1 wherein:
the positional relationship is such that the centerline of the plume emanating from said target does not intersect said substrate.

3. A method of forming a film upon a substrate according to claim 1 wherein:
said film-thickness distribution information is collected a plurality of times with the fixed positional relationship itself varied between said test substrate and the point of incidence of said laser beam upon said target.

4. A method of forming a film upon a substrate according to claim 1 wherein:
said adjustment of the deposition time is based on adjustment of the irradiation time of said laser beam.

5. A method of forming a film upon a substrate according to claim 1 wherein:
said adjustment of the deposition time is based on one or both of adjustment of the speed of revolution when continuously rotating said substrate, and adjustment of the movement speed when performing the relative movement of said substrate.

6. A method of forming a film upon a substrate according to claim 1 wherein:
said relative rotation is achieved by rotating said substrate or said substrate holder about its center.

7. A method of forming a film upon a substrate according to claim 1 wherein:
said relative movement is achieved by moving said substrate or said substrate holder as a whole.

8. A method of forming a film upon a substrate according to claim 1 wherein:
said relative movement is achieved by varying the light path of said laser beam and moving the spatial position of said point of incidence upon said target.

9. A method of forming a film upon a substrate according to claim 1 wherein:
during said deposition, said target is moved within the plane containing said target on the condition that said laser beam is constantly incident.

10. A method of forming a film upon a substrate according to claim 1 wherein:
a plurality of said laser beams is used.

11. A method of forming a film upon a substrate according to claim 9 wherein:
there is also a plurality of said targets, and at least one or more laser beams shines upon each one of said plurality of targets.

12. A method of forming a film upon a substrate according to claim 1 wherein:
a plurality of substrates is supported by said substrate holder.

13. A method of forming a film upon a substrate wherein deposition is performed while a substrate or a substrate holder supporting said substrate within a deposition chamber is moved or rotated relative to a source of supply of deposition materials about a specific axis of rotation, or while performing both relative rotation and relative movement, said method of forming the film upon the substrate comprising:
in a preliminary step, obtaining in advance information on a distribution of a thickness of a film deposited upon a test substrate prepared for use in collecting information over a fixed material supply time while in the state in which there is a fixed positional relationship between spatial positions of said test substrate and a reference point upon said deposition material supply source, or while rotating said test substrate, and then;
in a main step, adjusting said material supply time at each relative positional relationship based on the film-thickness distribution information obtained in advance in the preliminary step while spatially moving or rotating the substrate or substrate holder about a specific central axis of rotation relative to said deposition material supply source, or while performing both said relative rotation and said relative movement, and solving an inverse problem using a uniform or a desired film-thickness distribution and the film-thickness distribution information obtained in advance at each relative position, to thereby determine the deposition time at each relative position.

14. A method of forming a film upon a substrate according to claim 13, wherein:
an equation for solving the inverse problem is represented by $$C(r) = \sum_{i=1}^{N} B_i(r) \times t_i$$

where C(r) represents a function of the uniform or desired film-thickness distribution with respect to a distance r from the center of rotation of the substrate;
the film-thickness distribution information obtained in advance is represented by $B_i(r)$ that is a film-thickness distribution per unit time at an i-th position ($1 \leq i \leq N$, where N represents the number of relative positions), and $t_i$ represents a deposition time at the i-th position;
selecting a combination of $t_i$ for obtaining the uniform or desired film-thickness distribution; and
determining the selected combination $t_i$ as the deposition times at the respective positions i.

15. A method of forming a film upon a substrate according to claim 1 wherein:
an equation for solving the inverse problem is represented by $$C(r) = \sum_{i=1}^{N} B_i(r) \times t_i$$

where C(r) represents a function of the uniform or desired film-thickness distribution with respect to a distance r from the center of rotation of the substrate,
the film-thickness distribution information obtained in advance is represented by $B_i(r)$ that is a film-thickness distribution per unit time at an i-th position ($1 \leq i \leq N$ where N represents the number of relative positions), and $t_i$ represents a deposition time at the i-th position;
selecting a combination of $t_i$ for obtaining the uniform or desired film-thickness distribution; and
determining the selected combination of $t_i$ as the deposition times at the respective positions i.

16. A method of forming the film upon the substrate according to claim 1 wherein:
in the preliminary step,
i) a point at which the line normal to the target from the laser beam incidence point $T_0$ toward the surface of the test substrate prepared for use in collecting information intersects a plane containing the test substrate is represented by coordinates (X, Y) with a center of the test substrate as an origin o (0, 0), and N (more than one) arrangements on the test substrate represented by the coordinates (X, Y), a normal vector $r_a$ extending from the coordinate point toward the incident point $T_0$, and an angle of incidence θ of the laser beam are selected, ii) the laser beam is shined on the target at the selected arrangements i (1≦i≦N), and the film-thickness of the deposit produced upon the substrate within a unit time without rotating the test substrate are obtained for every arrangement, and the film-thickness distribution at the respective arrangements i is represented by a function $A_i(r, \theta_f)$ of polar coordinates r, $\theta_f$ from the center of rotation of the substrate or substrate holder at the respective arrangements i, and iii) the film-thickness distribution upon the substrate within a unit time, exhibited when rotating the substrate or substrate holder about its central axis at the selected arrangements i (1≦i≦N), is represented by a function of the radius r $$B_i(r) = (1/2\pi) \int_0^{2\pi} A_i(r, \theta_f) d\theta_f$$

to thereby obtain the film-thickness distribution information in advance.

17. A method of forming a film upon a substrate according to claim 1 wherein:

in the preliminary step, i) a point at which the line normal to the target from the laser beam incidence point $T_0$ toward the surface of the test substrate prepared for collecting information intersects a plane containing the test substrate is represented by coordinates (X, Y) with a center of the test substrate as the origin o (0, 0), and N (more than one) arrangements on the test substrate represented by the coordinates (X, Y), a normal vector $r_a$ extending from the coordinate point toward the incidence point $T_0$, and an angle of incidence θ of the laser beam, with $r_a$ and θ fixed, are selected, ii) the laser beam is shined on the target in the state in which the positional relationship between the spatial positions of the test substrate and the laser beam incidence point $T_0$ upon the substrate is fixed to $(X_0, Y_0)$, the film-thickness distribution of the deposit produced upon the substrate within a unit time is obtained, and the film-thickness distribution is represented by a function $A_0(r, \theta_f)$ of polar coordinates r, $\theta_f$ from the center of rotation of the substrate holder or substrate, and iii) the film-thickness distribution upon the substrate within a unit time, exhibited when rotating the substrate or substrate holder about its central axis at the selected arrangements j (1≦j≦N), is represented by a function $$B_j(r) = (1/2\pi) \int_0^{2\pi} A_0(r', \theta'_f) d\theta_f$$

where r'={$(r \cos \theta_f - x_s)^2 + (r \sin \theta_f - y_s)^2$}$^{1/2}$;

$\tan \theta'_f = (r \sin \theta_f - y_s)/(r \cos \theta_f - x_s)$;

$x_s = X_j - X_0$;

$y_s = Y_j - Y_0$, to thereby obtain the film-thickness distribution information in advance.

18. A method of forming a film upon a substrate according to claim 1 wherein:

in the preliminary step, i) a point at which the line normal to the target from the laser beam incidence point $T_0$ toward the surface of the test substrate prepared for use in collecting information intersects a plane containing the test substrate is represented by coordinates (X, Y) with a center of the test substrate as the origin o (0, 0), and N (more than one) arrangements on the test substrate represented by the coordinates (X, Y), a normal vector $r_a$ extending from the coordinate point toward the incident point $T_0$, and an angle of incidence θ of the laser beam are selected, ii) the film-thickness distribution upon the substrate within a unit time, exhibited when rotating the substrate or substrate holder about its central axis at a uniform speed at the selected arrangements i (1≦i≦N), is directly obtained, and the film-thickness distribution within a unit time at the respective arrangements i is represented by a function $B_i(r)$ of a radius from a center of rotation of the substrate holder or substrate, to thereby obtain the film-thickness distribution information in advance.

* * * * *